(12) United States Patent
Archibald et al.

(10) Patent No.: US 8,233,274 B2
(45) Date of Patent: Jul. 31, 2012

(54) COMPUTER CHASSIS COOLING SIDECAR

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/840,863

(22) Filed: Jul. 21, 2010

(65) Prior Publication Data

US 2012/0020009 A1    Jan. 26, 2012

(51) Int. Cl.
    *H05K 7/20* (2006.01)
(52) U.S. Cl. ......... 361/679.46; 361/679.48; 361/679.49; 361/679.5; 361/679.51; 361/690; 361/691; 361/695; 165/121; 165/126; 454/184
(58) Field of Classification Search ............. 361/679.46–679.53, 688, 689, 361/690–697, 715–727, 752, 831; 454/184; 165/104.33, 104.34, 121–127, 185; 312/223.2, 312/223.3, 236; 62/259.2
See application file for complete search history.

(56) References Cited

U.S. PATENT DOCUMENTS

| 4,158,875 | A | * | 6/1979 | Tajima et al. ................. 361/695 |
| 4,335,647 | A | | 6/1982 | Timmons |
| 5,345,779 | A | * | 9/1994 | Feeney .......................... 62/259.2 |
| 6,183,359 | B1 | | 2/2001 | Klein et al. |
| 6,616,524 | B2 | | 9/2003 | Storck, Jr. et al. |
| 6,882,531 | B2 | * | 4/2005 | Modica .................... 361/679.48 |
| 7,050,300 | B2 | | 5/2006 | Hein |
| 7,170,745 | B2 | * | 1/2007 | Bash et al. ..................... 361/695 |
| 7,266,964 | B2 | | 9/2007 | Vogel et al. |
| 7,379,298 | B2 | * | 5/2008 | Walsh et al. .................. 361/692 |
| 7,643,291 | B2 | * | 1/2010 | Mallia et al. .................. 361/695 |
| 7,903,407 | B2 | * | 3/2011 | Matsushima et al. ......... 361/695 |
| 7,907,402 | B2 | * | 3/2011 | Caveney ....................... 361/694 |
| 7,957,139 | B2 | * | 6/2011 | Davis et al. ................... 361/690 |
| 2006/0199508 | A1 | | 9/2006 | Nair et al. |
| 2008/0285232 | A1 | | 11/2008 | Claassen et al. |
| 2009/0061755 | A1 | * | 3/2009 | Calder et al. .................. 454/184 |
| 2009/0156114 | A1 | | 6/2009 | Ahladas et al. |
| 2010/0027216 | A1 | | 2/2010 | Matsushima et al. |
| 2010/0035535 | A1 | | 2/2010 | Taylor |
| 2010/0064610 | A1 | | 3/2010 | Kulkarni et al. |
| 2010/0126696 | A1 | * | 5/2010 | Novotny et al. ................ 165/67 |
| 2010/0151781 | A1 | * | 6/2010 | Slessman et al. ............. 454/184 |

* cited by examiner

*Primary Examiner* — Michail V Datskovskiy
(74) *Attorney, Agent, or Firm* — Edward J. Lenart; Cynthia G. Seal; Biggers & Ohanian, LLP.

(57) ABSTRACT

A computer chassis cooling sidecar for cooling one or more computers in a chassis of computers in a data center, the sidecar including an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber; wherein the chassis delivery chamber resides in front or back of the chassis and has an opening to receive air from the air intake chamber and an opening to deliver the received air to the front or back of the computer chassis.

13 Claims, 5 Drawing Sheets

COMPUTER CHASSIS COOLING SIDECAR

BACKGROUND OF THE INVENTION

1. Field of the Invention

The field of the invention is cooling one or more computers in a chassis of computers in a data center.

2. Description of Related Art

Typical data centers have floor tiles that are perforated. Cooled air is blown up from air conditioner beneath the data center through the perforated tiles in the floor to cool the computers. The chassis containing computers in the data center often have fans to blow cooled air from the front of the chassis to the back of the chassis to cool the computers. Furthermore, in conventional data centers, the chassis containing the computers are often aligned in rows. As such, the air blown up through the perforated tiles between the rows is located on the sides of the chassis is not utilized in an efficient manner to cool the computers.

SUMMARY OF THE INVENTION

A computer chassis cooling sidecar for cooling one or more computers in a chassis of computers in a data center, the sidecar including an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber residing in front or back of the chassis and having an opening to receive air from the air intake chamber and an opening to deliver the received air to the front or back of the computer chassis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
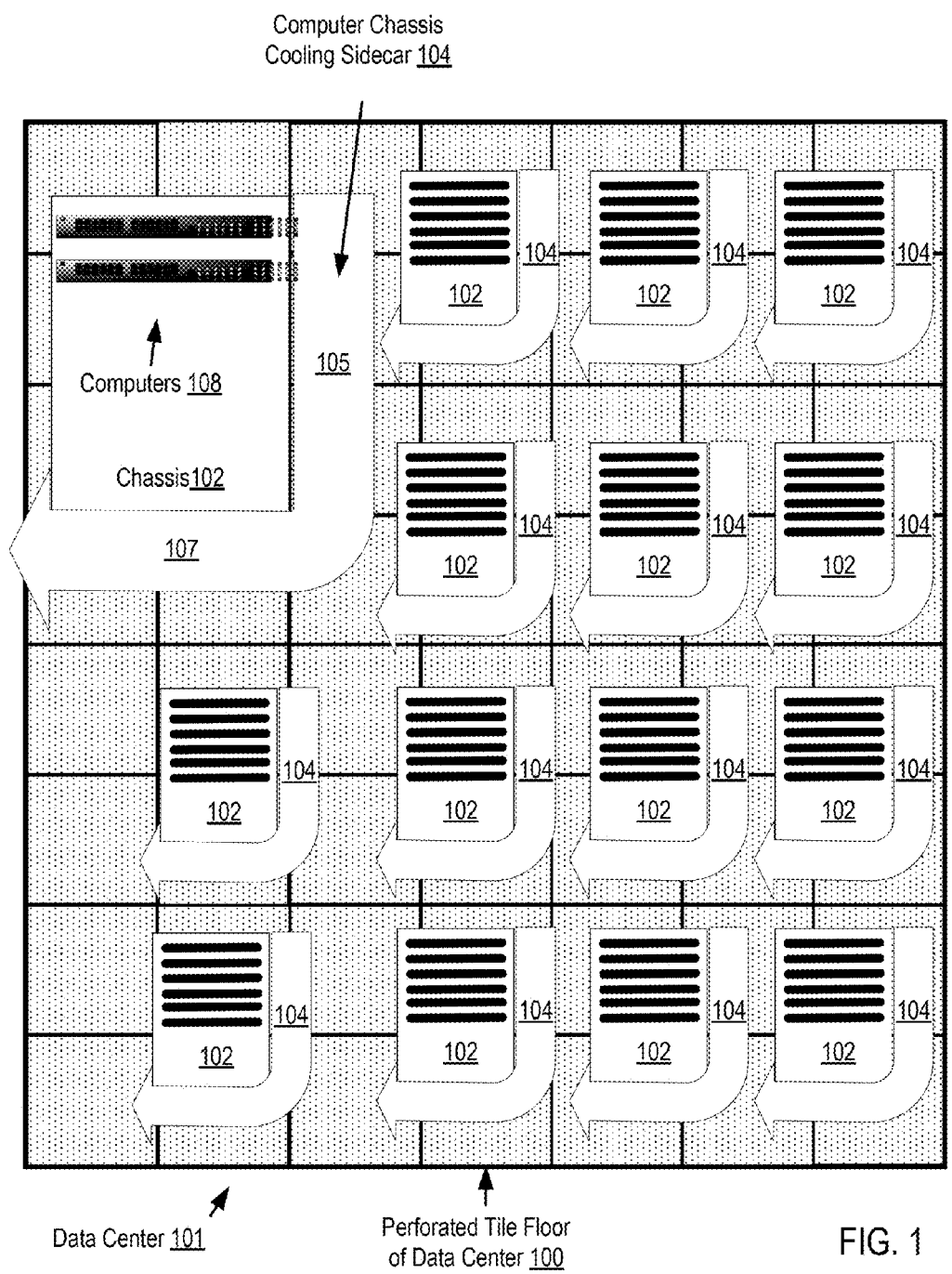
FIG. 1 sets forth a block diagram of an aerial view of a data center including a system for cooling one or more computers in a chassis of computers in a data center according to embodiments of the present invention.

Exemplary systems, computer chassis sidecar, and methods for cooling one or more computers in a chassis of computers in a data center in accordance with the present invention are described with reference to the accompanying drawings, beginning with FIG. 1. FIG. 1 sets forth a block diagram of an aerial view of a data center including a system for cooling one or more computers in a chassis of computers in a data center according to embodiments of the present invention. A data center is a facility used to house computer systems and associated components, such as telecommunications and storage systems. Data centers typically also include redundant or backup power supplies, redundant data communications connections, and environmental controls such as air conditioning, fire suppression, and security devices.

The data center (101) of FIG. 1 includes a number of chassis (102) of computers (108). Chassis of computers whose individual computers may be cooled according to embodiments of the present invention may include for example blade environments including chassis of blade servers, server racks and others as will occur to those of skill in the art.

The data center (101) of FIG. 1 also has a perforated tile floor (100) beneath which is installed an air conditioning system. Cooled air is blown from beneath the perforated tile floor to cool the racks (102) of computers (108) of the data center.

Each of the computer chassis (102) of FIG. 1 is cooled using a computer chassis cooling sidecar (104) according to embodiments of the present invention. Each computer chassis cooling sidecar includes an air intake chamber (105) residing on the side of the computer chassis and a chassis delivery chamber (107) residing to the front of the chassis. The air intake chambers have a first opening for receiving cooled air from the source of cooled air (100), the air conditioning units (199 in FIG. 4) beneath the perforated tile floor. The air intake chambers of the computer chassis side cars (104) of FIG. 1 have at the top end a directional vane shaped to direct airflow from the side of the chassis (102) to a chassis delivery chamber (107) that resides in front of the chassis (102) and has an opening to receive air from the air intake chamber (105) and an opening to deliver the received air to the front of the computer chassis (105).

In the example of FIG. 1, the air intake chambers (105) and the chassis delivery chambers (107) are connected to make L-shaped chambers. Such L-shaped chambers may be designed to conform to the size of the chassis that they are cooling and may designed to conform to the way the chassis are organized in the data center. Also in the example of FIG. 1, each computer chassis cooling sidecar (104) is attached to the exterior of each computer chassis (107). In alternative embodiments, the computer chassis cooling sidecar may be integrated within the interior of a computer chassis.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

The arrangement of servers and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
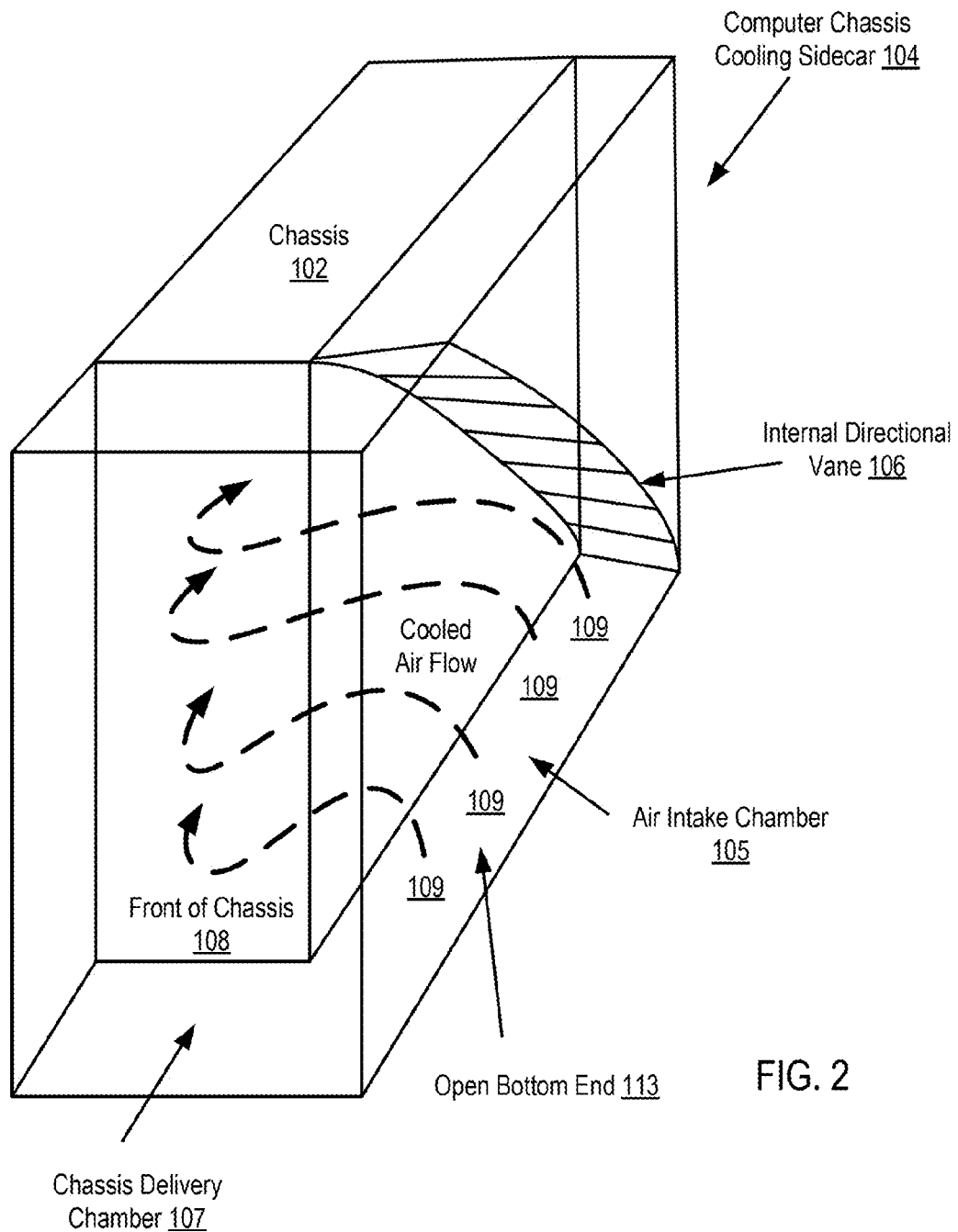
FIG. 2 sets forth a line drawing of a computer chassis cooling sidecar for cooling one or more computers in a chassis of computers in a data center according to embodiments of the present invention.

For further explanation, FIG. 2 sets forth a line drawing of a computer chassis cooling sidecar (104) for cooling one or more computers in a chassis of computers in a data center according to embodiments of the present invention. The computer chassis cooling the sidecar (104) of FIG. 2 includes an air intake chamber (105) and a chassis delivery chamber (107). The air intake chamber (105) of FIG. 2 has a first opening at a bottom end (113) for receiving air from beneath the data center through perforated tiles in the floor of the data center located on the side of the computer chassis. The air intake chamber (105) of FIG. 2 is enclosed at least on the exterior side and top such that cooled air is contained and directed to the chassis delivery chamber.

The air intake chamber (105) of FIG. 2 also has at the top end a directional vane (106) shaped to direct airflow (109) from the side of the chassis to a chassis delivery chamber (107). The chassis delivery chamber (107) of FIG. 2 resides in front of the chassis (102) and has an opening to receive air from the air intake chamber (105) and an opening to deliver the received air (109) to the front (108) of the computer chassis (102). Cool air then blows across the computers in the chassis (102). The chassis delivery chamber of FIG. 2 is also enclosed at least on the exterior sides such that cooled air is contained and directed to the chassis.

In the example of FIG. 2, the air intake chamber (105) is completely open to the chassis delivery chamber (107). This is for explanation and not for limitation. In alternative embodiments the size and shape of the opening between the air intake chamber and the chassis delivery chamber and the size and shape of the directional vane may vary according to many design factors such as air flow patterns, quantity of cooled air received in the air intake chamber, temperature of the air received in the air intake chamber, size of the sidecar, and many others as will occur to those of skill in the art.

In the computer chassis cooling sidecar (104) of FIG. 2, the chassis delivery chamber (107) also has an opening at a bottom end for receiving air from beneath the data center in front of the computer chassis. In such embodiments, additional cooled air is received from the front of the chassis and blown across the computers of the chassis.

In the computer chassis cooling sidecar (104) of FIG. 2, the air intake chamber (105) and the chassis delivery chamber (107) are connected to make an L-shaped chamber. This is for explanation, and not for limitation. Computer chassis cooling sidecars according to embodiments of the present invention may take on many shapes and sizes according to design considerations such as air flow patterns, quantity of cooled air received in the air intake chamber, temperature of the air received in the air intake chamber, size of the sidecar, and many others as will occur to those of skill in the art.

In some embodiments of the computer chassis cooling sidecar (104) of FIG. 2 the computer chassis cooling sidecar is attached to the exterior of a computer chassis (102). In alternative embodiments, the computer chassis cooling sidecar (104) is integrated within the interior of a computer chassis.

Computer chassis cooling sidecars of the present invention may be made of plastic, metal or any other material that will occur to those of skill in the art. Often such sidecars may be made of lightweight material such that they May be moved to various computers in the data center.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

Figure 3:
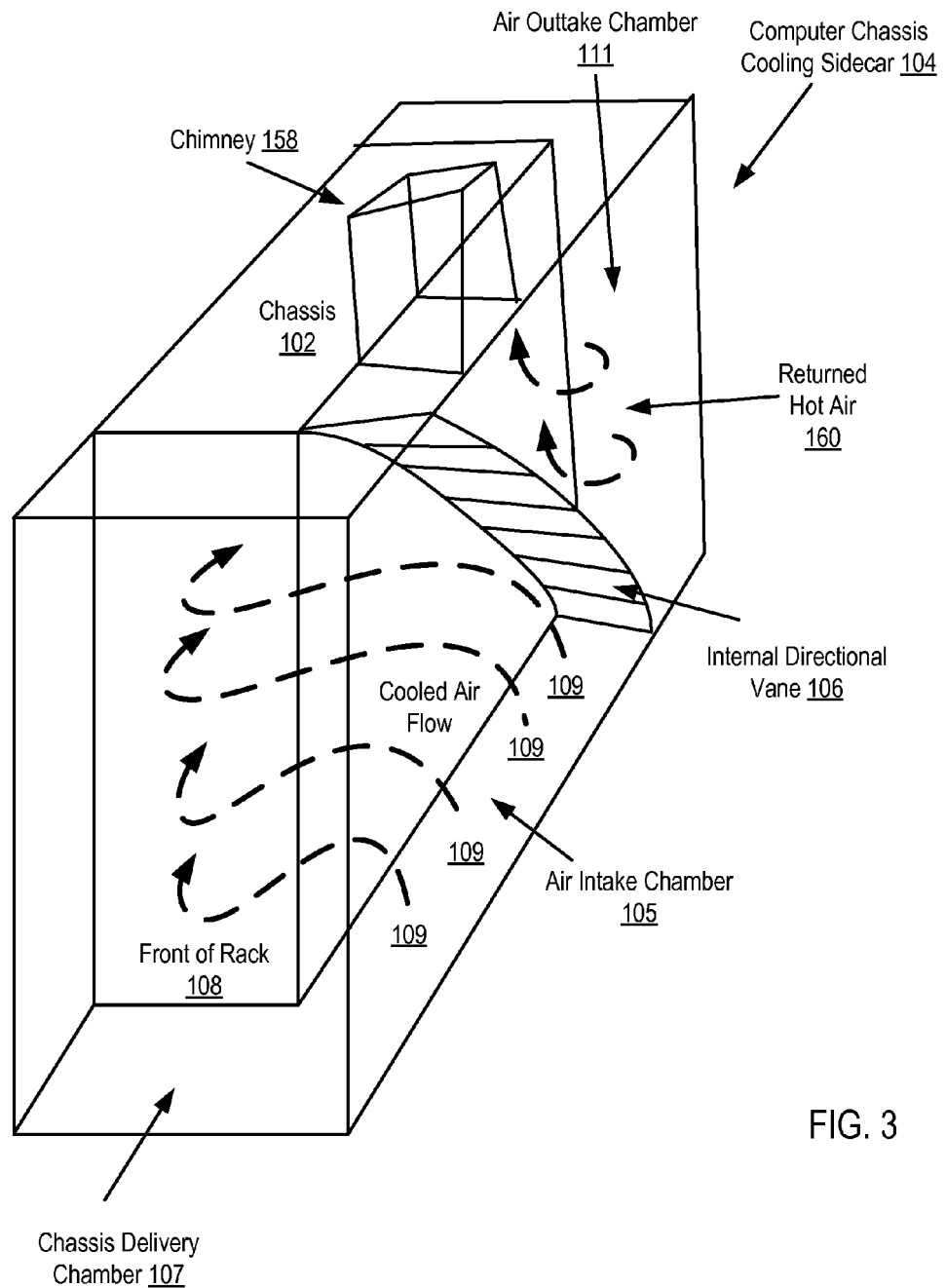
FIG. 3 sets forth a line drawing of another computer chassis cooling sidecar for cooling one or more computers in a chassis of computers in a data center according to embodiments of the present invention.

For further explanation, FIG. 3 sets forth a line drawing of another computer chassis cooling sidecar (104) for cooling one or more computers in a chassis of computers in a data center according to embodiments of the present invention. The computer chassis cooling sidecar (104) of FIG. 3 is similar to the computer chassis cooling sidecar of FIG. 2 in that it includes an air intake chamber (105) and a chassis delivery chamber (107). The air intake chamber (105) of FIG. 3 has a first opening at a bottom end (113) for receiving air from beneath the data center through perforated tiles in the floor of the data center located on the side of the computer chassis. The air intake chamber (105) of FIG. 3 also has at the top end a directional vane (106) shaped to direct airflow (109) from the side of the chassis to a chassis delivery chamber (107). The chassis delivery chamber (107) of FIG. 3 also resides in front of the chassis (102) and has an opening to receive air from the air intake chamber (105) and an opening to deliver the received air (109) to the front (108) of the computer chassis (102). Fans in the chassis may then blow cooled air across the computers in the chassis (102).

The computer chassis cooling sidecar (104) of FIG. 3 differs from the computer chassis cooling sidecar (104) of FIG. 2 in that the computer chassis cooling sidecar (104) also includes an air outtake chamber (111) that is thermally separated from the air intake chamber (105) by the directional vane (106). The side of the directional vane (106) in the example of FIG. 3 exposed to the air outtake chamber (111) is shaped to direct airflow (160) from the air outtake chamber (111) to a chimney (158). After the cooled air is blown across the computers of the chassis, the returned hot air (160) is directed out the chimney (158) and to the top of the data center where it may be recycled to the air conditioners below the floor of the data center.

As discussed above with reference to the example of FIG. 2, the size, shape and materials used in computer chassis cooling sidecars according to embodiments of the present invention may vary according to many design factors that will occur to those of skill in the art.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis.

Figure 4:
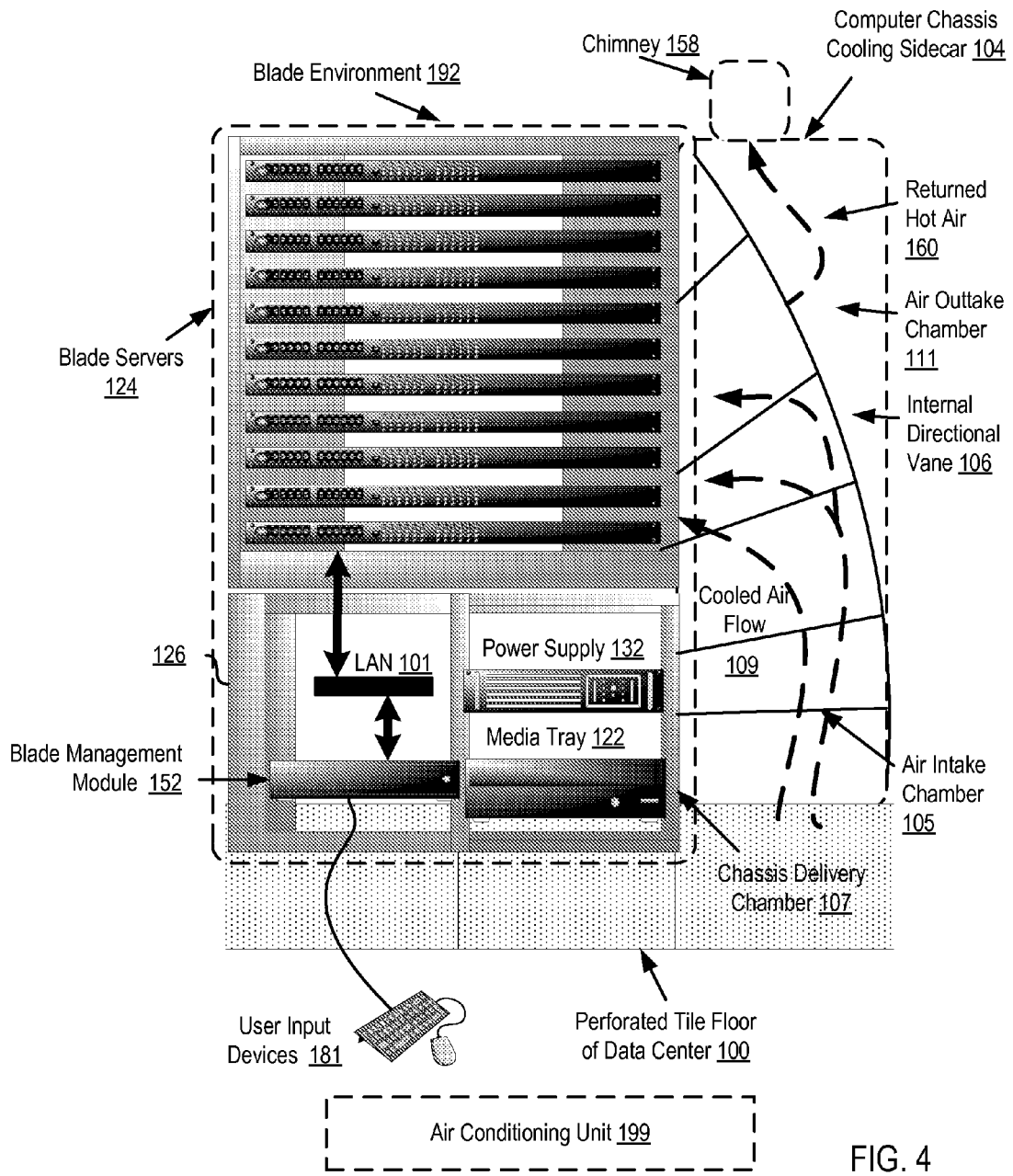
FIG. 4 sets forth a diagram of a system for cooling one or more computers in a chassis of computers in a data center according to embodiments of the present invention.

For further explanation, FIG. 4 sets forth a diagram of a front view of a system for cooling one or more computers in a chassis of computers in a data center according to embodiments of the present invention. The example of FIG. 4 includes a blade environment (192). 'Blade environment,' as the term is used in this specification, refers generally to a blade server system installed in this example in a two-bay chassis (126) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 4 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 4, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives ('CD-ROM'), Digital Video Disc ROM drives (DVD-ROM), CD-RW drives, DVD-RW drives, floppy disk drives, and so on as will occur those of skill in the art.

The system of FIG. 4 includes a chassis cooling sidecar (104) for cooling one or more computers in a chassis of the blade environment. The sidecar (104) of FIG. 1 includes an air intake chamber (105) and a chassis delivery chamber in front of the chassis (107). The air intake chamber (105) has a first opening at a bottom end for receiving air from beneath the data center through perforated tiles (100) in the floor of the data center located on the side of the computer chassis. The air intake chamber (105) having at the top end a directional vane (106) shaped to direct airflow (109) from the side of the chassis to a chassis delivery chamber (107) that resides in front of the chassis (126) and has an opening to receive air from the air intake chamber (105) and an opening to deliver the received air (109) to the front of the computer chassis (102).

The computer chassis cooling sidecar of FIG. 4 also includes an air outtake chamber (111) thermally separated from the air intake chamber (105) by the directional vane (106) and wherein a side of the directional vane (106) exposed to the air outtake chamber (111) is shaped to direct airflow (160) from the air outtake chamber (111) to a chimney (158) and out of the sidecar (104). In the computer chassis cooling sidecar (104) of FIG. 4 the chimney is located at a top of the computer chassis cooling side car. This is for explanation and not for limitation. In fact, chimneys for exiting returned hot air may be located in other places on the sidecar such as on the side or back of the sidecar.

Computer chassis cooling sidecars according to embodiments of the present invention may also include hinged doors, sliding doors, windows, or any other closable access to the chassis of computer chassis such that a systems administrator may access the computers within the chassis without moving the side car. To increase airflow to the computer chassis, the perforated floor tiles below the computer chassis cooling sidecar may be removed.

In the example of FIG. 1, the chassis delivery chamber (107) resides in the front of the chassis. In alternative embodiments, such a chassis delivery chamber may reside in the back of the chassis. In still further embodiments, a chassis delivery chamber may reside both in front and in back of the chassis.

The arrangement of the blade environment (192), network (101), and other devices making up the exemplary system illustrated in FIG. 4 are for explanation, not for limitation. Data processing systems useful according to various embodiments of the present invention may include additional servers, routers, and other devices, not shown in FIG. 4, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 4.

Figure 5:
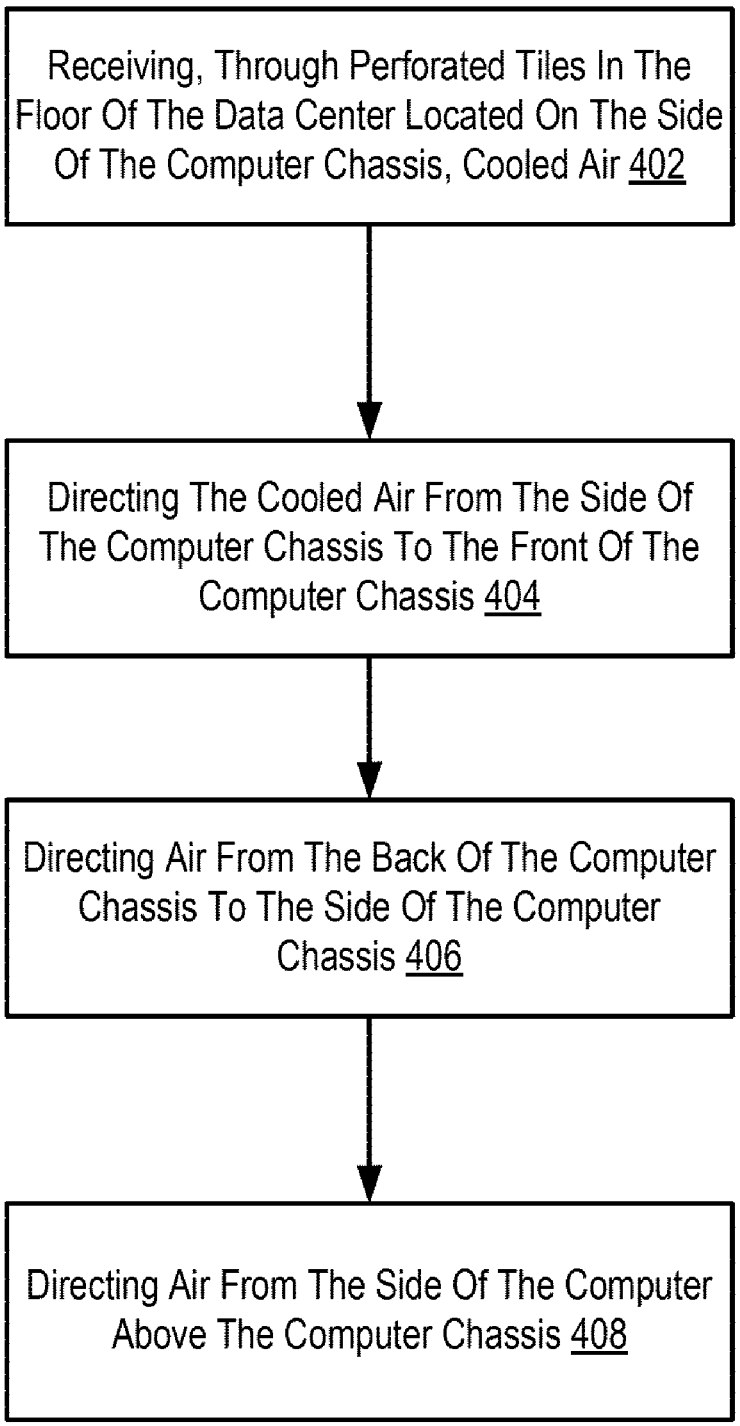
FIG. 5 sets forth a flow chart illustrating an exemplary method for cooling one or more computers in a chassis of computers in a data center according to embodiments of the present invention.

For further explanation, FIG. 5 sets forth a flow chart illustrating an exemplary method for cooling one or more computers in a chassis of computers in a data center according to embodiments of the present invention. The method of FIG. 5 includes receiving (402), through perforated tiles in the floor of the data center located on the side of the computer chassis, cooled air. Receiving (402), through perforated tiles in the floor of the data center located on the side of the computer chassis, cooled air may be carried out by an air intake chamber designed to collect air from the side of the chassis. In some embodiments, such an air intake chamber may reside in a sidecar according to embodiments of the present invention.

The method of FIG. 5 also includes directing (404) the cooled air from the side of the computer chassis to the front of the computer chassis. Directing (404) the cooled air from the side of the computer chassis to the front of the computer chassis may be carried out by a direction vane shaped to direct air to the front of a computer chassis according to embodiments of the present invention. In some embodiments, such a directional vane may reside within a sidecar according to embodiments of the present invention. In alternative embodiments the directional vane may be implemented as the top or top and sides of a chamber shaped to wrap from the side of a chassis to the front of a chassis.

The method of FIG. 5 also includes directing (406) air from the back of the computer chassis to the side of the computer chassis. Directing (406) air from the back of the computer chassis to the side of the computer chassis may be implemented with an insulated directional vane in an air outtake chamber of a computer chassis side car according to embodiments of the present invention.

The method of FIG. 5 also includes directing (408) air from the side of the computer above the computer chassis. Directing (408) air from the side of the computer above the computer chassis may be carried out through a chimney of an air outtake chamber of a computer chassis side car according to embodiments of the present invention.

Exemplary embodiments of the present invention are described largely in the context of a fully functional system, sidecar and method for cooling one or more computers in a chassis of computers in a data center. Readers of skill in the art will recognize, however, that some aspects of the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer chassis cooling sidecar for cooling one or more computers in a chassis of computers in a data center, the sidecar comprising:
    an air intake chamber and a chassis delivery chamber, the air intake chamber having a first opening at a bottom end for receiving air from beneath the data center through perforated tiles in the floor of the data center located on the side of the computer chassis, the air intake chamber having at the top end a directional vane shaped to direct airflow from the side of the chassis to a chassis delivery chamber;
    wherein the chassis delivery chamber resides in front or back of the chassis and has an opening to receive air from the air intake chamber and an opening to deliver the received air to the front or back of the computer chassis;
    wherein the computer chassis cooling sidecar includes an air outtake chamber thermally separated from the air intake chamber by the directional vane and wherein a side of the directional vane exposed to the air outtake chamber is shaped to direct airflow from the air outtake chamber to a chimney, and wherein the chimney is located at a top of the computer chassis cooling side car.

2. The computer chassis cooling sidecar of claim 1 wherein the chassis delivery chamber also has an opening at a bottom end for receiving air from beneath the data center in front or back of the computer chassis.

3. The computer chassis cooling sidecar of claim 1 wherein the air intake chamber and the chassis delivery chamber are connected to make an L-shaped chamber.

4. The computer chassis cooling sidecar of claim 1 wherein the computer chassis cooling sidecar is attached to the exterior of a computer chassis.

5. The computer chassis cooling sidecar of claim 1 wherein the chassis of computers further comprises a blade environment.

6. A system for cooling one or more computers in a chassis of computers in a data center, the system comprising:
    a computer chassis cooling sidecar comprising an air intake chamber and a chassis delivery chamber, the air intake chamber having a first opening for receiving cooled air from source of cooled air,
    the air intake chamber having at the top end a directional vane shaped to direct airflow from the side of the chassis to a chassis delivery chamber; and wherein the chassis delivery chamber resides in front or back of the chassis and has an opening to receive air from the air intake chamber and an opening to deliver the received air to the front or back of the computer chassis; and
    a source of cooled air providing cooled air to the air intake chamber;
    wherein the computer chassis cooling sidecar includes an air outtake chamber thermally separated from the air intake chamber by the directional vane and
    wherein a side of the directional vane exposed to the air outtake chamber is shaped to direct airflow from the air outtake chamber to a chimney, and wherein the chimney is located at a top of the computer chassis cooling side car.

7. The system of claim 6 wherein the source of cooled air comprises an air conditioning unit below the floor of a data center.

8. The system of claim 6 wherein the chassis delivery chamber also has an opening at a bottom end for receiving air from beneath the data center in front or back of the computer chassis.

9. The system of claim 6 wherein the air intake chamber and the chassis delivery chamber are connected to make an L-shaped chamber.

10. The system of claim 6 wherein the computer chassis cooling sidecar is attached to the exterior of a computer chassis.

11. The system of claim 6 wherein the computer chassis cooling sidecar is integrated within the interior of a computer chassis.

12. A method of cooling one or more computers in a chassis of computers in a data center using a computer chassis cooling sidecar, the sidecar comprising:
    receiving, through perforated tiles in the floor of the data center located on the side of the computer chassis, cooled air; and
    directing the cooled air from the side of the computer chassis to the front or back of the computer chassis;
    wherein the computer chassis cooling sidecar includes an air outtake chamber thermally separated from an air intake chamber by a directional vane and wherein a side of the directional vane exposed to the air outtake chamber is shaped to direct airflow from the air outtake chamber to a chimney, and wherein the chimney is located at a top of the computer chassis cooling side car.

13. The method of claim 12 further comprising:
    directing air from the back of the computer chassis to the side of the computer chassis;
    directing air from the side of the computer above the computer chassis.

* * * * *